(12) United States Patent
Sasaki et al.

(10) Patent No.: US 6,391,791 B1
(45) Date of Patent: May 21, 2002

(54) DRY-ETCHING METHOD AND APPARATUS, PHOTOMASKS AND METHOD FOR THE PREPARATION THEREOF, AND SEMICONDUCTOR CIRCUITS AND METHODS FOR THE FABRICATION THEREOF

(75) Inventors: Takaei Sasaki; Noriyuki Harashima, both of Saitama-ken; Satoshi Aoyama; Shouichi Sakamoto, both of Hyogo-ken, all of (JP)

(73) Assignees: Ulvac Coating Corporation, Saitama-ken (JP); Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/361,159

(22) Filed: Jul. 27, 1999

(30) Foreign Application Priority Data

Aug. 7, 1998 (JP) .......................... 10-224845
Oct. 29, 1998 (JP) .......................... 10-309002

(51) Int. Cl.$^7$ .......................... H01L 21/302; B44C 1/22
(52) U.S. Cl. .................. 438/725; 438/710; 438/714; 438/719; 438/720; 438/722; 438/723; 438/724; 216/11; 216/12; 216/64; 216/65; 430/5
(58) Field of Search .................. 438/725, 710, 438/714, 719, 720, 722, 723, 724; 430/5; 216/64, 75, 11, 12

(56) References Cited

U.S. PATENT DOCUMENTS

| | | | | |
|---|---|---|---|---|
| 4,489,146 A | * | 12/1984 | Bock et al. ............ | 430/5 |
| 4,613,401 A | * | 9/1986 | Hoshino ................ | 156/643 |
| 4,925,524 A | * | 5/1990 | Beatty ................. | 156/643 |
| 5,354,417 A | * | 10/1994 | Cheung et al. ......... | 156/659.1 |
| 5,554,223 A | * | 9/1996 | Imahashi .............. | 118/723 I |
| 5,554,249 A | * | 9/1996 | Hasegawa et al. ...... | 156/345 |
| 5,843,847 A | * | 12/1998 | Pu et al. .............. | 438/723 |
| 5,814,563 A | * | 9/1999 | Ding et al. ........... | 438/714 |

FOREIGN PATENT DOCUMENTS

| | | | |
|---|---|---|---|
| EP | 731501 | * | 9/1996 |
| EP | 978870 A2 | * | 2/2000 |
| EP | 978870 A3 | * | 5/2000 |
| JP | 53-112671 | * | 10/1978 |
| JP | 06-230557 | * | 8/1994 |
| JP | 6-347996 | | 12/1994 |
| JP | 07-070772 | * | 3/1995 |
| JP | 09-263974 | * | 10/1997 |
| JP | 2765065 | | 4/1998 |
| JP | 10-140377 | * | 5/1998 |
| JP | 11054481 | * | 2/1999 |

OTHER PUBLICATIONS

"Silicon Shallow Trench Etch Using $HBr/Cl_2/He/O_2$ Chemistry"; Proc.–Electrochemical Soc.;(1996); Zhao et al.; abstract only.*

* cited by examiner

*Primary Examiner*—George Goudreau
(74) *Attorney, Agent, or Firm*—Arent Fox Kintner Plotkin & Kahn, PLLC

(57) ABSTRACT

A dry-etching method comprises the step of dry-etching a metal thin film as a chromium-containing film, wherein the method is characterized by using, as an etching gas, a mixed gas including (a) a reactive ion etching gas, which contains an oxygen-containing gas and a halogen-containing gas, and (b) a reducing gas added to the gas component (a), in the process for dry-etching the metal thin film. The dry-etching method permits the production of a photomask by forming patterns to be transferred to a wafer on a photomask blank. The photomask can in turn be used for manufacturing semiconductor circuits. The method permits the decrease of the dimensional difference due to the coexistence of coarse and dense patterns in a plane and the production of a high precision pattern-etched product.

6 Claims, 11 Drawing Sheets

Fig. 1

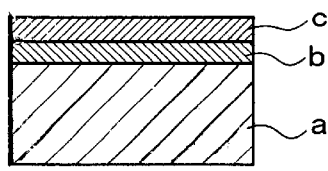

Fig. 2

| Flow | Electron Beam Patterning Process | Laser Beam Patterning Process |
|---|---|---|
| Receipt of Blank | | |
| Exposure/Patterning | Electron Beam Patterning Device | Laser Beam Patterning Device |
| Development | Spray, Dip, Paddle Systems | |
| | Organic Solvent Development Alkali Development | Alkali Development |
| Post-Baking | Hot Plate Oven Convection Oven | Generally, any treatment is not required. |
| De-scumming | Plasma De-scumming Device | Generally, any treatment is not required. |
| CrEtching | Wet Etching and Dry-Etching | |
| Removal of Resist | Solvent Pealing, Ashing | Exposure of Whole Surface/Alkali Pealing, Solvent Pealing, Ashing |
| Washing | Sheet-Fed Acid-Treatment, Physical Scrubbing, or the like | |
| To Inspection Step | | |

FIG. 6A
Test Pattern on Dense Portion (A-A')
(a) EB Patterning
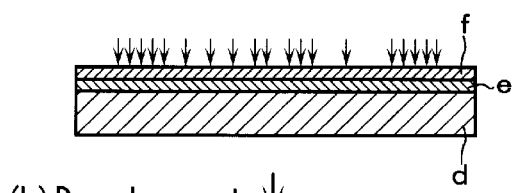
(b) Development ↓
(c) Etching ↓
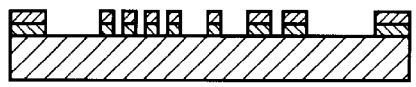
↓
(d) Removal of Resist
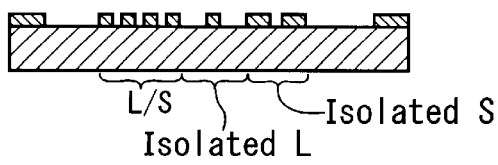
FIG. 6B
Test Pattern on Coarse Portion (B-B')
(a) EB Patterning
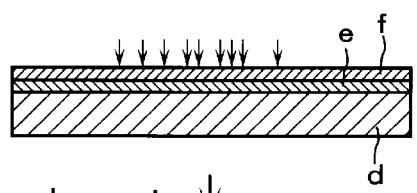
(b) Development ↓
(c) Etching ↓
↓
(d) Removal of Resist
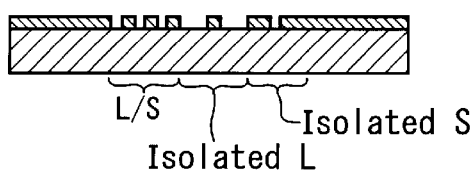

$O_2$: 20 SCCM

| Flow Rate of Added HCl (SCCM) | 0 | 15 | 30 | 60 | 120 |
|---|---|---|---|---|---|
| Etching Time (sec.) | 786 | 663 | 624 | 636 | 750 |
| Cr Etching Rate (Å/min.) | 80.2 | 95.0 | 101.0 | 99.1 | 84.0 |
| Etching Rate of Resist (Å/min.) | 72.3 | 78.5 | 78.3 | 77.4 | 78.2 |
| Range/Average (%) | 15.2 | 17.7 | 16.7 | 16.6 | 18.2 |
| Selection Ratio | 1.11 | 1.21 | 1.29 | 1.28 | 1.07 |

$O_2$: 25 SCCM

| Flow Rate of Added HCl (SCCM) | 0 | 15 | 30 | 60 | 120 |
|---|---|---|---|---|---|
| Etching Time (sec.) | | | 630 | | |
| Cr Etching Rate (Å/min.) | | | 100.0 | | |

$O_2$: 35 SCCM

| Flow Rate of Added HCl (SCCM) | 0 | 15 | 30 | 60 | 120 |
|---|---|---|---|---|---|
| Etching Time (sec.) | | | | | 634 |
| Cr Etching Rate (Å/min.) | | | | | 99.4 |

DRY-ETCHING METHOD AND APPARATUS, PHOTOMASKS AND METHOD FOR THE PREPARATION THEREOF, AND SEMICONDUCTOR CIRCUITS AND METHODS FOR THE FABRICATION THEREOF

BACKGROUND OF THE INVENTION

1. Field of the Invention

The present invention relates to a method for dry-etching a metal thin film and more specifically to a method and an apparatus for dry-etching such a metal thin film, which is applied to a process for preparing a photomask which is used in fabricating, for instance, a semiconductor device as well as a dry-etching method which is used in a pattern-etching process for forming a fine pattern of a metal thin film such as fine electrode patterns (for a flat panel display (FPD) or the like) and color filters. In addition, the present invention also pertains to a photomask which is provided with a pattern formed using such a dry-etching method and a method for preparing the photomask as well as a semiconductor circuit fabricated using such a photomask and a method for fabricating the semiconductor circuit.

2. Description of the Prior Art

As a photomask blank, there have been known, for instance, those having such a structure as shown in FIG. 1, which comprises a glass substrate a formed from, for instance, synthetic quartz glass; a light-shielding film b consisting of a thin film of a metal such as chromium, formed on the surface of the substrate; and a resist layer c of a light-sensitive/electron-sensitive resin, which is formed on the light-shielding film. The glass substrate a may serve as a support for patterns and therefore, must have a variety of desired characteristic properties such as high transmittance, high uniformity, defect-free characteristics, resistance to washing and excellent flatness. In addition, the light-shielding film b may serve as a light-shielding material for patterning and therefore, should satisfy the desired requirements for various properties such as etching controllability, uniformity, defect-free characteristics, resistance to washing, low stress and high adhesion to the glass substrate. Moreover, the resist layer c has a role as a film for forming the light-shielding film and accordingly, should have a variety of desired characteristic properties such as high-sensitivity/high resolution, resistance to etching, uniformity, defect-free characteristics and high adhesion to the light-shielding film.

A photomask provided thereon with a fine electric circuit pattern has been prepared by wet-etching or dry-etching a chromium light-shielding film using a photomask blank having such a structure according to the electron beam patterning process or the laser beam patterning process. An example of such a mask-processing scheme is shown in FIG. 2.

In the wet-etching, there have recently been highlighted a limit in the dimension control due to the undercut and a limit in the verticality of the etched cross section, and the dry-etching technique has thus been widely used instead.

The dry-etching methods for preparing a photomask and the dry-etching apparatus for practicing the methods are described in, for instance, J. P. KOKAI No. Hei 6-347996, the disclosure of which is hereby incorporated by reference. In this dry-etching technique, a chromium film is etched using a gas comprising, for instance, chlorine gas to which oxygen gas is added, as a reactive ion etching gas.

Moreover, the dry-etching method for preparing a photomask of a chromium-containing film is disclosed in, for instance, Japanese Patent No. 2,765,065, the disclosure of which is hereby incorporated by reference. This patent discloses, in Examples, that when the chromium-containing film is dry-etched by this dry-etching method while using a resist film of a positive electron beam resist EBR-9 (which is available from Toray Industries, Inc.) as a mask and a mixed gas comprising 160 SCCM of chlorine gas, 40 SCCM of oxygen gas and 160 SCCM of wet air as a dry-etching gas, there is not observed any change in the etching rate of the electron beam resist film, while the etching rate of the chromium-containing film increases and the selective (or etching) ratio against the resist film is improved. As a result, the chromium-containing film can sufficiently be patterned by this dry-etching technique. In this connection, the wet air (160 SCCM) in the mixed etching gas comprises about 128 SCCM of nitrogen gas and about 32 SCCM of oxygen gas corresponding to the component ratio of nitrogen to oxygen in the air which is equal to 4:1.

In addition, the semiconductor circuit has recently become more and more finer and the size of the semiconductor circuit is increasingly reduced from 0.2 $\mu$m to 0.15 $\mu$m. For instance, in case of a semiconductor circuit fabricated using a conventional photomask, the dimensional error observed for the memory circuit portion is large as compared with that observed for the peripheral circuit portion in the memory circuit which comprises the memory circuit portion and the peripheral circuit portion, while such an error is also large even in the logic circuit and thus these errors may adversely affect the characteristic properties of the resulting circuit. For this reason, there has been desired for the development of a photomask which permits the fabrication of a circuit whose dimensional difference between circuits within a semiconductor chip is as low as possible.

If a chromium film as a light-shielding film is subjected to dry-etching using a chlorine-containing gas and if a pattern is formed on a plane at an almost uniform density, the film can be chromium-etched at an approximately uniform rate throughout the whole surface and accordingly, the dimensional control within a plane can be achieved to such an extent that the in-plane uniformity 3 $\sigma$ (3×the variance of (measured line width–averaged line width)) ranges from 20 to 60 nm for the line width ranging from 1 to 2 $\mu$m.

However, dense patterns (patterns whose area occupied by a resist is small) and coarse patterns (patterns whose area occupied by a resist is large) often coexist in the plane of a practical photomask and if the dry-etching technique is used for forming such a photomask, the etching rate of a chromium film is high at the densely patterned portion and low at the coarsely patterned portion. As a result, the dimensional difference within a plane reaches up to about 100 nm for a designed line width ranging from 1 to 2 $\mu$m. A photomask having such a large dimensional difference within the plane cannot be used for the fabrication of, for instance, circuits having a higher integration density such as memory circuits, logic circuits and LSI circuits.

The Japanese Patent No. 2,765,065 described above does not relate to the solution of the foregoing problems, but relates to the improvement of the selective ratio of a chromium film to a resist film.

SUMMARY OF THE INVENTION

Accordingly, an object of the present invention is generally to solve the foregoing problems associated with the conventional technique or an improved dry-etching technique as a means for forming a fine pattern, which permits the reduction of the dimensional difference due to the coexistence of coarse and dense patterns within a plane, for instance, a dry-etching technique for manufacturing a chromium-containing photomask. More specifically, it is an object of the present invention to provide a dry-etching method and a dry-etching apparatus, which permit the production of a high precision photomask by reducing the dimensional difference due to the coexistence of coarse and dense patterns within a plane.

Another object of the present invention is to provide a method for preparing a photomask using the foregoing dry-etching method and to provide a photomask thus prepared.

A further object of the present invention is to provide a method for fabricating a semiconductor device using the photomask and a semiconductor circuit fabricated by the method.

The inventors of the present invention have conducted various studies to achieve the foregoing objects, have found that even in the production of a photomask in which dense patterns and coarse patterns coexist in the plane thereof, the use of a mixed etching gas comprising an oxygen-containing halogen gas such as an oxygen-containing chlorine gas (e.g., $Cl_2+O_2$), to which at least a hydrogen-containing gas (e.g., $H_2$, hydrogen chloride (HCl) gas) is added, in the etching of the chromium film permits the achievement of in-plane dimensional control almost identical to that achieved for a mask in which patterns are formed in the plane at an almost uniform density, i.e., such in-plane dimensional control that the dimensional difference is not more than a half of that conventionally attained, for instance, 10 to 50 nm (0.010 to 0.050 $\mu$m) and thus have completed the present invention on the basis of such a finding for the designed line width ranging from 1 to 2 $\mu$m.

According to a first aspect of the present invention, there is provided a dry-etching method characterized by using, as an etching gas, a mixed gas including (a) a reactive ion etching gas, which contains an oxygen-containing gas and a halogen-containing gas, and (b) a reducing gas added thereto, in a process for dry-etching a metal thin film.

According to a second aspect of the present invention, there is provided a method for preparing a photomask by performing a series of pattern-forming steps such as a step for forming a resist layer on a photomask blank, a step for exposing and patterning the resist layer, a developing step, a step for etching the photomask blank and a step for removing the resist layer and which is characterized in that patterns to be transferred onto a wafer are formed on the photomask blank according to the dry-etching method described above to thus give a photomask.

According to a third aspect of the present invention, there is provided a photomask which is prepared through a series of pattern-forming steps such as a step for forming a resist layer on a photomask blank, a step for exposing and patterning the resist layer, a developing step, a step for etching the photomask blank and a step for removing the resist layer and which is characterized in that patterns to be transferred onto a wafer are formed on the photomask blank according to the dry-etching method described above to thus give a photomask.

According to a fourth aspect of the present invention, there is provided a method for manufacturing a semiconductor circuit which comprises the steps of transferring the patterns formed on the photomask according to the third aspect of the invention on a wafer on which a light-sensitive material is coated, developing the light-sensitive material to form resist patterns on the wafer, to manufacture a semiconductor circuit which comprises coexisting coarse and dense patterns corresponding to the resist patterns.

According to a fifth aspect of the present invention, there is provided a semiconductor circuit which has a circuit comprising coexisting coarse and dense patterns corresponding to the resist patterns formed by transferring the resist patterns formed on the photomask according to the third aspect of the invention on a wafer on which a light-sensitive material is coated and then developing the light-sensitive material.

According to a sixth aspect of the present invention, there is provided a dry-etching apparatus used in dry-etching a metal thin film, which is provided with a sequencer for establishing dry-etching conditions, wherein the metal thin film is a chromium-containing film; wherein if an etching gas used consists of chlorine, oxygen and hydrogen gases, the relative flow rates of these gases as expressed in terms of % by volume range from 73 to 46, 19 to 11 and 9 to 42% by volume, respectively, or if an etching gas used consists of chlorine, oxygen and hydrogen chloride gases, the relative flow rates of these gases as expressed in terms of % by volume range from 70 to 36, 18 to 9 and 13 to 55% by volume, respectively; and wherein the apparatus is designed in such a manner that when inputting the parameters relating to the foregoing dry-etching conditions, directly or through a memory device of a computer, to the sequencer and then starting the dry-etching process, the dry-etching is automatically carried out under the foregoing dry-etching conditions.

According to a seventh aspect of the present invention, there is provided a dry-etching apparatus which comprises an etching chamber, a transport chamber, a substrate cassette bed and a sequencer for establishing dry-etching conditions, wherein four electromagnets each comprising a square-shaped ring-like coil are provided on the outer side of the etching chamber, two each of these electromagnets being opposite to one another and making a pair, these electromagnets being so designed that when applying a low frequency current which is 90 deg. out of phase thereto, the combined magnetic field established by these two paired electromagnets can rotate in a plane parallel to a substrate at a frequency identical to that of the low frequency current, an RF electrode and an opposite electrode are disposed in the etching chamber, a transport robot for transporting the substrate is provided in the transport chamber, the transport robot being a two-joint robot having two knots, the tip of a transport arm thereof being able to undergo advancing, reciprocating and rotating motions due to the composition of rotational motions of a motor axis and these two knots within each horizontal plane, the robot thus transporting the substrate, wherein a metal thin film to be dry-etched is a chromium-containing film, wherein if an etching gas used consists of chlorine, oxygen and hydrogen gases, the relative flow rates of these gases as expressed in terms of % by volume range from 73 to 46, 19 to 11 and 9 to 42% by volume, respectively, or if an etching gas used consists of chlorine, oxygen and hydrogen chloride gases, the relative flow rates of these gases as expressed in terms of % by volume range from 70 to 36, 18 to 9 and 13 to 55% by volume, respectively, and wherein the apparatus is designed in such a manner that when inputting the parameters relating to the foregoing dry-etching conditions, directly or through a memory device of a computer, to the sequencer and then starting the dry-etching process, the dry-etching is automatically carried out under the foregoing dry-etching conditions.

BRIEF DESCRIPTION OF THE DRAWINGS

The aforementioned and other objects, features and advantages of the present invention will be become more apparent from the following description taken with reference to the accompanying drawings, wherein FIG. 1 is a cross sectional view showing the structure of a photomask blank;

FIG. 2 is a mask process flow diagram for explaining the process for preparing a photomask;

FIG. 6(A) is a flow diagram for explaining the preparation of measuring patterns (or test patterns) at a densely patterned portion along the line (A–A') in FIG. 5(B), and FIG. 6(B) is a flow diagram for explaining the preparation of measuring patterns at a coarsely patterned portion along the line (B–B') in FIG. 5(B);

DESCRIPTION OF THE PREFERRED EMBODIMENTS

Figure 3:
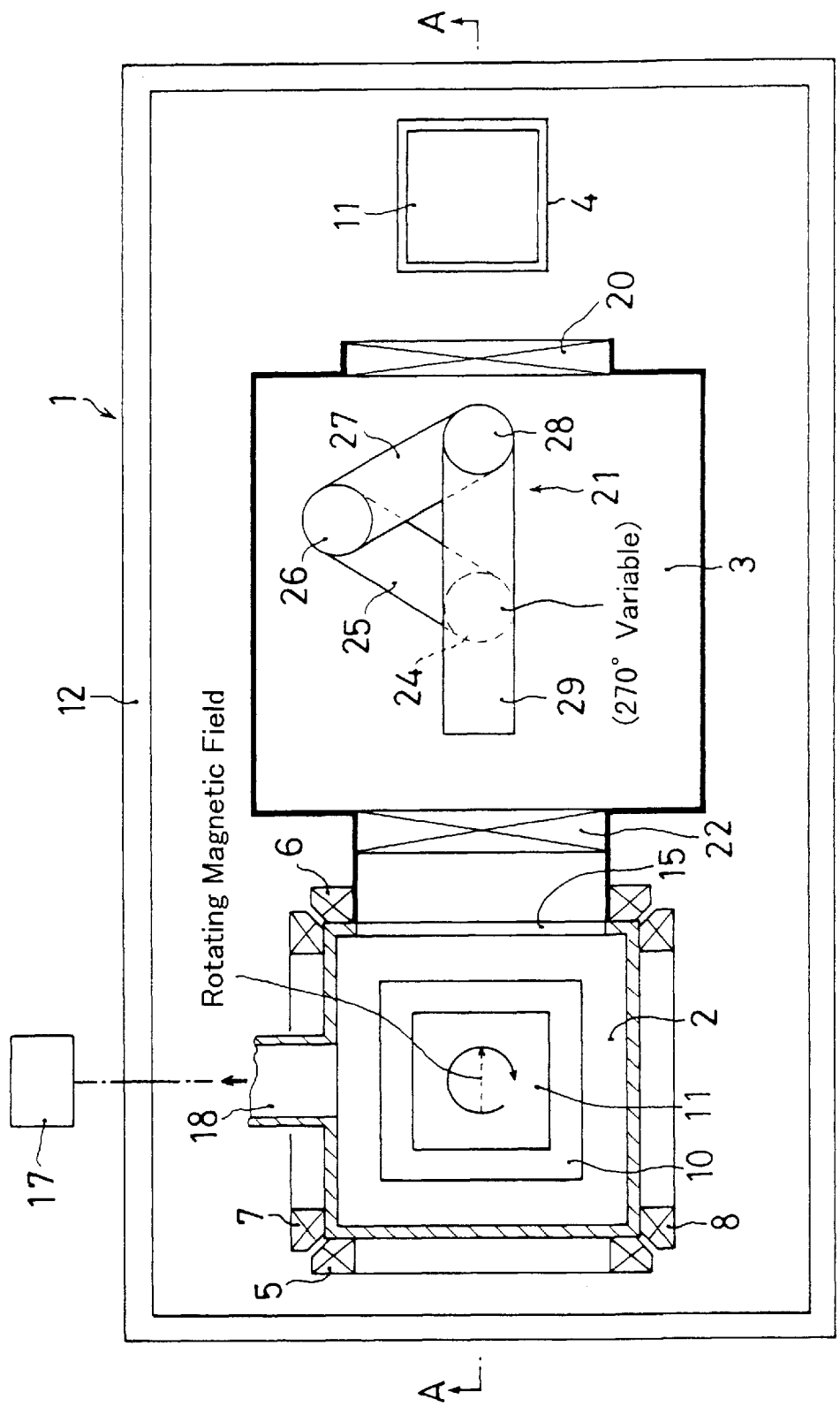
FIG. 3 is a partially cutaway plan view showing a dry-etching apparatus used for carrying out the present invention.

The dry-etching method according to the present invention is carried out using, as a reactive etching gas, a mixed gas comprising (a) a reactive etching gas, which consists of an oxygen-containing gas and a halogen-containing gas, and (b) a reducing gas added thereto in the process for dry-etching a metal thin film. This metal thin metal includes a thin film comprising Al, Au, Pt, Ag, Si, Ge, Cr, Fe, Cu, Ni, Ta, Mo, W or Zr, or an alloy of two or more metals selected from these metals. In addition, this metal thin film may be a thin film such as a metal film, a metal oxide film, a metal nitride film, a metal fluoride film or a laminated film thereof.

In addition, the reducing gas used herein may be a gas containing at least hydrogen, i.e., hydrogen gas; a hydrocarbon gas selected from the group consisting of $C_nH_{2n+2}$ (n=1 to 8), $C_nH_{2n}$(n=2 to 10), $C_nH_{2n-2}$(n=2 to 8); an alcoholic gas selected from the group consisting of $CH_3OH$, $C_2H_5OH$, $CH_3CH_2CH_2OH$, $(CH_3)_2CHOH$, $(CH_3)_3COH$, $CH_2$=$CHCH_2OH$; a hydrogen halide gas selected from the group consisting of HF, HCl, HBr and HI; ammonia gas; or water.

If the metal thin film is a chromium-containing film, and if the etching gas or the mixed gas used consists of chlorine, oxygen and hydrogen gases, the flow rates of these gases as expressed in terms of % by volume preferably range from 73 to 46, 19 to 11 and 9 to 42% by volume, respectively, while if the mixed gas used consists of chlorine, oxygen and hydrogen chloride gases, the flow rates of these gases as expressed in terms of % by volume preferably range from 70 to 36, 18 to 9 and 13 to 55% by volume, respectively. This is because if the flow rates each is beyond the foregoing range, it is difficult to obtain a highly precision photomask having a reduced dimensional difference due to the coexistence of coarse and dense patterns in a plane.

Moreover, the oxygen-containing gas used in the invention may be a gaseous oxygen-containing compound which can be an oxygen source, such as $O_2$, CO, $CO_2$, NO and $N_2O$ and the halogen-containing gas usable herein may be a gaseous halogen (such as chlorine, fluorine)-containing compound such as chlorine gas, $CCl_4$, $CF_2Cl_2$, $CFCl_3$ or $CF_3Cl$, which is a commonly used reactive ion etching gas.

The dry-etching apparatus used for practicing the method of dry-etching the metal thin film according to the present invention is not restricted to any particular one and may be, for instance, an apparatus which makes use of a variety of systems such as barrel type, RIE, MERIE, ICP, NLD and ECR. Preferred are those depicted in FIGS. 3 and 4, which are equipped with a sequencer for establishing dry-etching conditions, wherein if the metal thin film is a chromium-containing film and if the mixed gas used as etching gas consists of chlorine, oxygen and hydrogen gases, the flow rates of these gases as expressed in terms of % by volume range from 73 to 46, 19 to 11 and 9 to 42% by volume, respectively; or wherein if the mixed gas used as etching gas consists of chlorine, oxygen and hydrogen chloride gases, the flow rates of these gases as expressed in terms of % by volume range from 70 to 36, 18 to 9 and 13 to 55% by volume, respectively; and wherein the apparatus is designed in such a manner that when inputting the parameters relating to the foregoing dry-etching conditions, directly or through a memory device of a computer, to the sequencer and then starting the dry-etching process, the dry-etching is automatically carried out under the foregoing dry-etching conditions.

The dry-etching apparatus equipped with the foregoing sequencer according to the present invention comprises an etching chamber, a transport chamber and a substrate cassette bed, wherein four electromagnets each comprising a square-shaped ring-like coil are provided on the outer side of the etching chamber, two each of these electromagnets being opposite to one another and making a pair, these electromagnets being so designed that when applying a low frequency current which is 90 deg. out of phase thereto, the combined magnetic field established by these two paired electromagnets can rotate in a plane parallel to the substrate at a frequency identical to that of the low frequency current, an RF electrode and an opposite electrode being disposed in the etching chamber, a transport robot for transporting the substrate being provided in the transport chamber, the transport robot being a two-joint robot having two knots, the tip of the transport arm thereof being able to undergo advancing, reciprocating and rotating motions due to the composition of rotational motions of a motor axis and these two knots within each horizontal plane, and the robot thus transporting the substrate.

In Examples given later, all of the pressure, RF electric power, magnetic field, distance between electrodes, kinds of etching gases and the flow rate ratio: $Cl_2/O_2$ in the etching gas mixture are fixed to predetermined values respectively, but they are not restricted to these specific values and the dry-etching operations may be performed under the following conditions, if an MERIE apparatus is, for instance, used:

Pressure: 1.3 to 66.7 Pa (10 to 500 mTorr)

RF Electric Power: 10 to 300 W (RF Electric Power density: 0.10 to 0.4 $W/cm^2$)

Flow Rate Ratio, $O_2/(Cl_2+O_2)$: 10 to 25%

$Cl_2/O_2$: 20 to 160/5 to 100 SCCM

Magnetic Field: 0 to 150 Gs

Interelectrode Distance: 40 to 120 mm

According to the present invention, a photomask can be prepared by a series of well-known pattern-forming steps such as a step for forming a resist layer on a photomask blank, a step for exposing and patterning the resist layer, a developing step, a step for etching the photomask blank and a step for removing the resist layer, wherein patterns to be transferred onto a wafer are formed on the photomask blank using the dry-etching method described above as the dry-etching process. In addition, the photomask of the present invention is characterized in that patterns to be transferred onto a wafer are formed on a photomask blank using the dry-etching method described above as the dry-etching process among a series of the foregoing well-known pattern-forming steps.

The present invention further permits the manufacture of a semiconductor circuit by transferring the resist patterns formed on the photomask produced by the foregoing method on a wafer on which a light-sensitive material is coated, developing the light-sensitive material to form the resist patterns on the wafer, and then subjecting the wafer to etching such as dry-etching or ion-implantation on the basis of the resist patterns thus formed on the wafer to thereby form a circuit having patterns corresponding to the resist patterns. Examples of semiconductor circuits thus obtained include a memory circuit in which patterns are regularly arranged, a logic circuit comprising randomly arranged patterns, and a system LSI circuit comprising combined memory and logic circuits.

The following are characteristic properties of the semiconductor circuit obtained using the photomask of the present invention. For instance, a memory circuit comprises a memory circuit portion on which patterns are regularly arranged and a peripheral circuit portion on which patterns are irregularly arranged to ensure the connection to the exterior and therefore, the areas occupied by the patterns in these circuit portions are different from one another. More specifically, in a gate-forming process in manufacturing a transistor which has an important influence upon the characteristics of the resulting circuit, the rate of area to be removed for patterning in the peripheral circuit portion is high as compared with that observed for the memory cell portion. The semiconductor circuit has recently become more and more finer and the size of the semiconductor circuit is increasingly reduced from 0.2 μm to 0.15 μm. In case of the semiconductor circuit fabricated using the photomask according to the present invention, the dimensional difference observed between the memory cell and peripheral circuit portions is very small, the variation in the dimension is also small and therefore, the characteristics of the circuit are not adversely affected at all. For this reason, the present invention permits the manufacture of an excellent semiconductor circuit whose memory cell and peripheral circuit portions have almost the same characteristic properties.

The same effect is also observed for the logic circuit in which patterns are randomly arranged and the distribution of the area to be removed for patterning is also random and thus the invention permits the manufacture of a quite excellent semiconductor circuit having a very low dimensional difference within the chip. The present invention can further be applied to the production of a system LSI circuit comprising a combination of a memory circuit portion and a logic circuit portion. In this case, the memory circuit portion and the logic circuit portion differ from each other in the packing densities of devices and the densities of wiring, but the dimensional difference between the memory and logic circuit portions is very small and therefore, does not adversely affect the characteristic properties of the resulting circuit. As a result, a good semiconductor circuit can thus be produced, which does not have any difference between the memory and logic circuit portions in their characteristics.

The present invention will hereinafter be described in more detail with reference to the following Examples and attached figures, but these Examples are given only for the purpose of illustration and the present invention is not restricted to these specific Examples at all.

Figure 4:
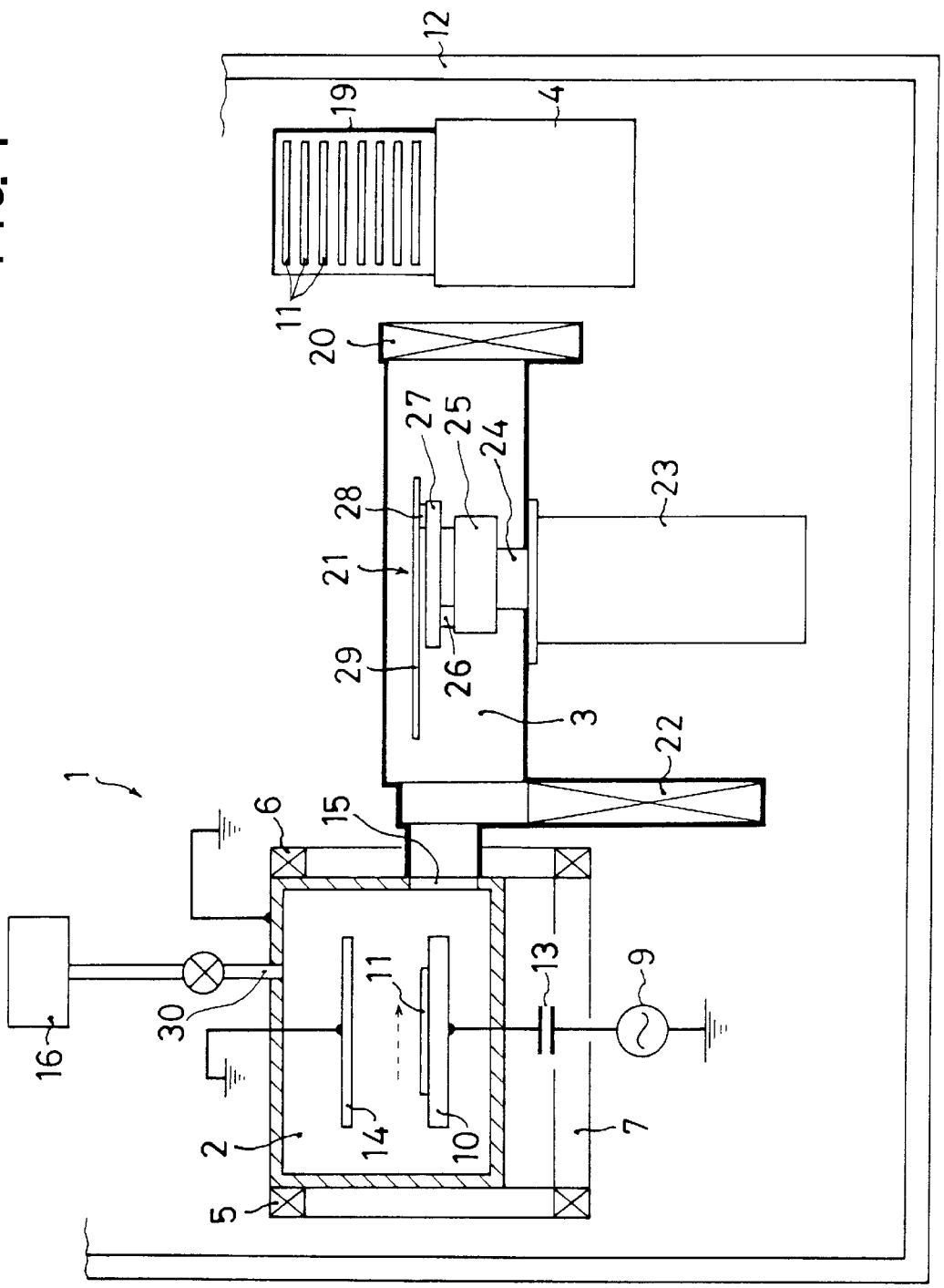
FIG. 4 is a cross sectional view of the dry-etching apparatus shown in FIG. 3 taken along the line A—A.

The dry-etching apparatus (MERIE apparatus) used in the following Examples is shown in FIGS. 3 and 4. This dry-etching apparatus 1 is so designed that an etching chamber 2, a transport chamber 3 and a substrate cassette bed 4 are accommodated in a panel 12 which constitutes the outer periphery of the dry-etching apparatus and that the etching chamber 2 is accommodated in electromagnets 5, 6, 7, 8 disposed on the outer periphery of the chamber 2. Each electromagnet comprises a square-shaped ring-like coil, the electromagnets 5 and 6 and the electromagnets 7 and 8 make pairs respectively and a low frequency current whose phase is shifted, for instance, 90 deg. is passed through these electromagnets. These electromagnets are so designed that the coils of the paired electromagnets are wound in the same direction and the combined magnetic field established by these two paired electromagnets 5 and 6, and 7 and 8 can rotate in a plane parallel to the substrate at a frequency identical to that of the low frequency current as shown by the dotted arrows in FIGS. 3 and 4. Disposed within the etching chamber 2 are a plate-like RF electrode 10 which is connected to an RF power supply 9 through a condenser 13 and a plate-like opposite electrode 14 and a substrate 11 may be placed on the RF electrode 10 through a substrate delivery port 15 formed on the side of the etching chamber 2.

The opposite electrode 14 and the etching chamber 2 are maintained at the ground voltage. To supply a reactive gas for etching to the etching chamber 2, a gas supply system 16 is disposed at a reactive gas supply port 30, which is provided with a gas bomb and a mass flow controller and an exhaust system 17 is connected to a vacuum exhaust port 18 of the etching chamber 2, which is equipped with a vacuum pump for controlling the gas pressure in the etching chamber 2. The reactive gas herein used is one comprising an oxygen-containing mixed gas and a reducing gas at least containing hydrogen, as has already been discussed above.

A plurality of substrates 11 are accommodated in a cassette case 19, then the cassette case is put on the substrate cassette bed 4, each substrate delivered from the cassette case 19 is brought into the transport chamber 3 through a partition valve 20 by the action of a transport robot 21 and then placed on the RF electrode 10 in the etching chamber 2 through a vacuum valve 22 and the substrate delivery port 15. The transport robot 21 is a known two-joint robot having two knots 26 and 28 and is so designed that the tip of a transport arm 29 thereof can undergo reciprocating and rotating motions due to the composition of rotational motions of a motor axis 24 and these two knots 26 and 28. The motions of a first arm 25 and a second arm 27 are restricted to only those within the horizontal planes. The movement of the tip of the transport arm 29 between the cassette case 19 and the transport chamber 3 through the partition valve 20 and that of the tip of the transport arm 29 between the RF electrode 10 in the etching chamber 2 and the transport chamber 3 through the substrate delivery port 15 are advancing and reciprocating motions due to the composition of rotational motions of each arm 25, 27, 29 of the robot at the motor axis 24 and the foregoing two knots 26 and 28. The transport of the substrate between the vacuum valve 22 at the upstream side of the substrate delivery port 15 and the partition valve 20 on the side of the cassette case 19 is performed by the half turn motion, within a horizontal plane, of the transport arm 29 of the robot, wherein the motor axis 24 serves as a rotating center. If a motor 23 disposed on the exterior of the transport chamber 3 is rotated, the plate-like transport arm 29 carrying a substrate 11 undergoes reciprocating and rotational motions to thus transport the substrate between the cassette case 19 and the RF electrode 10.

When etching a pattern-forming material of the substrate 11 on the RF electrode 10, the etching chamber 2 is evacuated by operating the exhaust system 17, followed by introduction of a reactive gas into the chamber 2 through the reactive gas supply port 30, excitation of the two pairs of electromagnets 5, 6, 7, 8 and application of an RF electric power to the RF electrode 10 to thus generate plasma. If the same low frequency alternating current is passed through these two paired electromagnets 5 and 6, and 7 and 8 in the same direction, while shifting the phase of the current applied to either of the paired electromagnets 90 deg. relative to that of the other current, a rotating magnetic field is established in a plane parallel to the substrate 11. The plasma generated between the RF electrode 10 and the opposite electrode 14 is concentrated on the surface of the substrate 11 by the action of the rotating magnetic field and this leads to an increase of its density. Thus, the reactive gas introduced into the chamber is highly efficiently dissociated and the substrate 11 is subjected to reactive ion-etching under such a condition that only a slight DC bias voltage is generated on the substrate.

For instance, it is assumed that the dry-etching is carried out using, as the substrate 11, a photomask substrate which comprises a transparent substrate of synthetic quartz or the like, a thin layer of a pattern-forming material such as Cr, Cr provided with an antireflection film or $SiO_2$ which is applied onto the transparent substrate and a patterned photoresist layer (for instance, a resist for EB exposure (e.g. ZEP-810S (trade name) available from Nippon Zeon Co., Ltd.)) provided on the pattern-forming material. In this case, if the substrate 11 is dry-etched with the introduced reactive gas under the same conditions used for the dry-etching of the IC substrate, this results in insufficient selection ratio of the material to be etched to the resist and insufficient in-plane dimensional uniformity of the photomask since the photomask substrate 11 is not made of silicon, but is made from synthetic quartz unlike the IC substrate and the pattern-forming material applied thereon does not comprise poly Si or an oxide layer+poly Si, but comprises Cr, Cr provided with an antireflection film or $SiO_2$, unlike the IC substrate. However, the selection ratio and the in-plane dimensional uniformity can be improved and a highly precision photomask can be produced if establishing the following dry-etching conditions: a magnetic field intensity ranging from 50 to 150 Gs; a pressure of the reactive gas in the etching chamber 2 ranging from 0.03 to 0.3 Torr (4 to 40 Pa); and an RF electric power density on the RF electrode 10 ranging from 0.20 to 0.32 $W/cm^2$.

The following are specific Examples of the present invention.

EXAMPLE 1

Figure 5A:
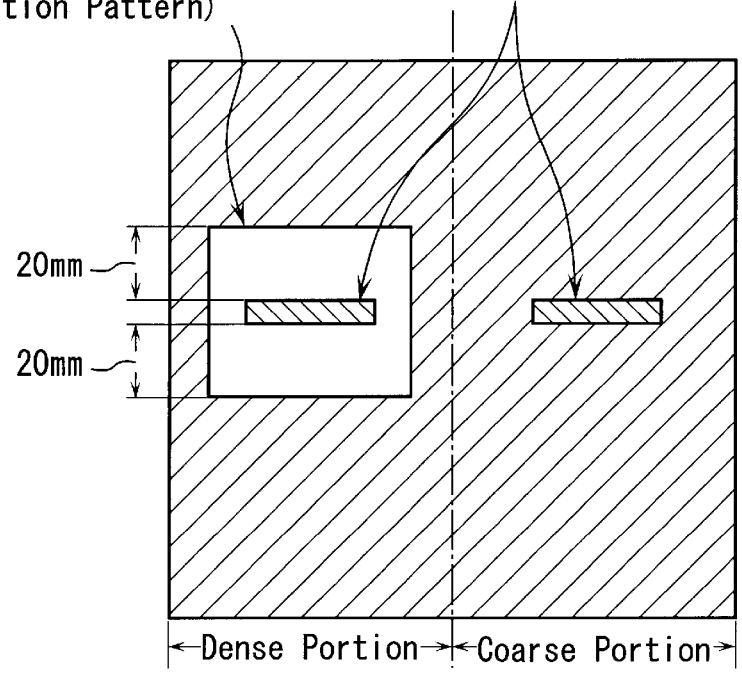
FIG. 5(A) is a schematic plan view showing the arrangement of test patterns used in Example 1 and FIG. 5(B) shows the pattern arrangement as shown in FIG. 5(A) and is a schematic plan view showing the positions (or lines A–A' and B–B') along which the cross sectional views shown in FIGS. 6(A) and 6(B) are taken.
Figure 5B:
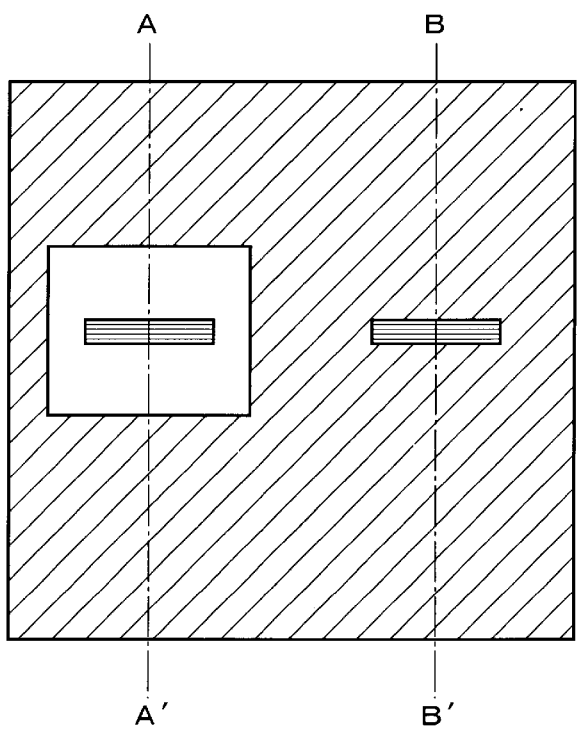

A dry-etching method carried out according to the present invention will be described in this Example. Test patterns used in this Example are shown in FIGS. 5(A) and 5(B) and the flow diagrams for illustrating the preparation of test samples are shown in FIGS. 6(A) and 6(B). FIG. 6(A) is a flow diagram, as expressed in terms of schematically cross sectional diagrams, for explaining the preparation of measuring patterns at a densely patterned portion along the line (A–A') in FIG. 5(B), and FIG. 6(B) is a flow diagram, as expressed in terms of schematically cross sectional diagrams, for explaining the preparation of measuring patterns at a coarsely patterned portion along the line (B–B') in FIG. 5(B). As will be clear from the flow diagrams shown in FIGS. 6(A) and (B), each test sample was prepared through processes for (a) EB patterning, (b) developing, (c) etching and (d) removing the resist. In FIGS. 6(A) and (B), d represents a substrate, e represents a chromium film and f represents a resist layer. The details of the etching processes shown in FIGS. 6(A) and (B) are as follows:

The conditions for operating the MERIE apparatus as shown in FIGS. 3 and 4, which permit the dry-etching of a chromium film using a conventional chlorine-containing gas have already been described above, but in this Example, the test patterns as shown in FIGS. 5(A) and (B) were formed by dry-etching a chromium photomask blank under the conditions disclosed in Table 1, using an etching gas comprising the foregoing gas system ($Cl_2/O_2$=80/20 SCCM) to which hydrogen gas was added in an amount specified in the following Table 1 and using the MERIE apparatus as shown in FIGS. 3 and 4, on the basis of the following working conditions of the apparatus among others:

| Pressure: | 6.8 Pa (50 mTorr) |
|---|---|
| RF Power Supply: | 80 W |
| Gas: | $Cl_2/O_2$ = 80/20 SCCM |
| Magnetic Field: | 50 to 60 Gs |
| Interelectrode Distance: | 60 mm |

The photomask blank used in this Example was one prepared by applying a single chromium layer in a thickness of about 800 to 900 Å as a pattern-forming material onto the surface of a square-shaped synthetic quartz substrate having a size of 152.4×152.4 mm and a thickness of 6.35 mm or further applying a single or two chromium layer provided with a chromium oxide-containing antireflection film in a thickness of about 150 Å thereon and then applying a resist layer (ZEP-810S (trade name) available from Nippon Zeon Co., Ltd.) for EB exposure onto the layer of the pattern-forming material. Moreover, the test patterns as shown in FIGS. 5(A) and (B) comprised, after the EB exposure and the development, a dimension-evaluation pattern (about 6.5 mm×35 mm) which was arranged at the central portion of the left half (dense portion) of the mask and which included a plurality of L/S (Line and Space), ISO Line (Isolated L) and ISO Space (Isolated S) patterns therein; a completely removed pattern (the pattern of the exposed chromium having a size of 46 mm×54 mm) surrounding these patterns; and a dimension-evaluation pattern which was arranged at the central portion of the right half (coarse portion) of the mask.

Figure 7:
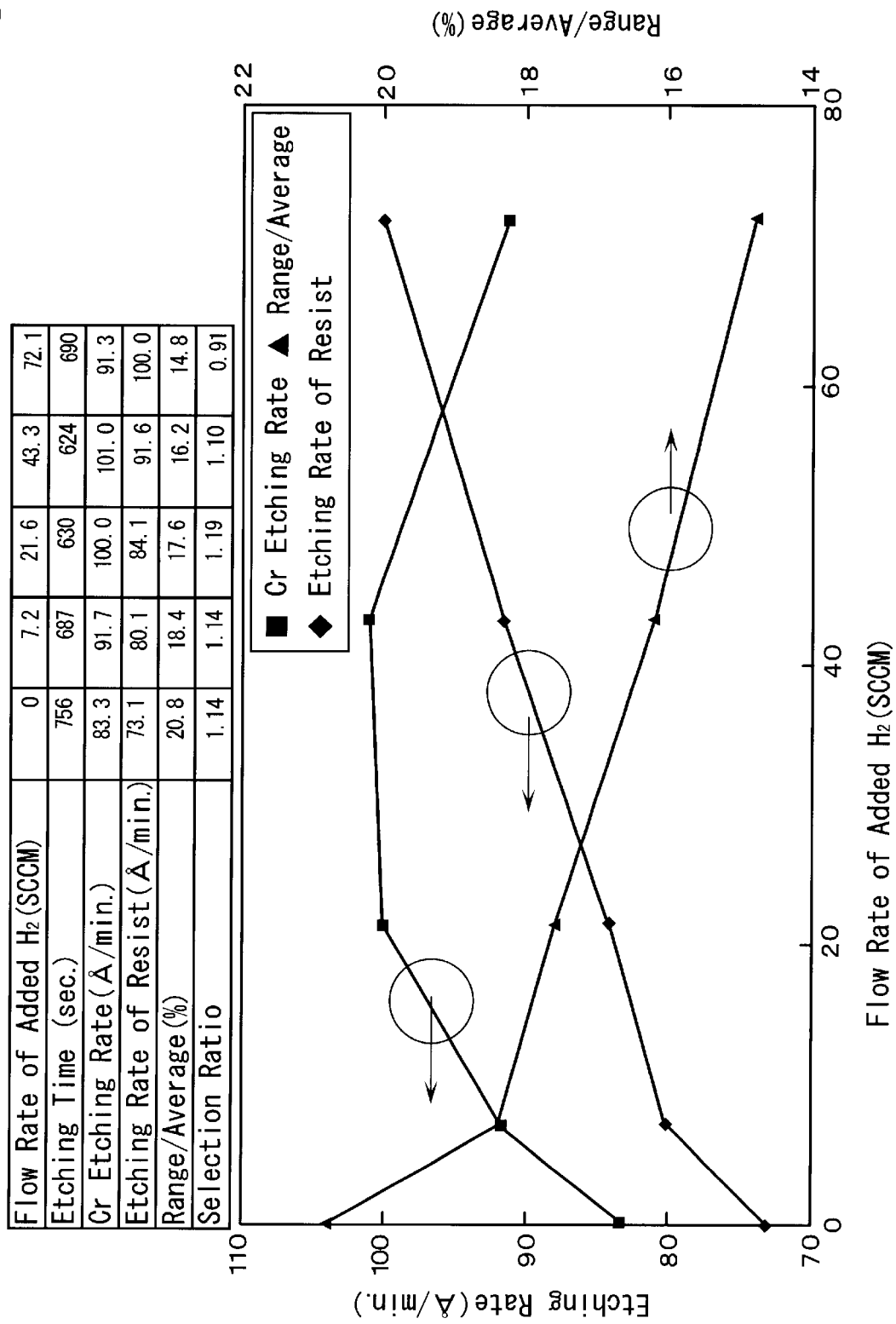
FIG. 7 is a graph showing the influence of the flow rate of added hydrogen gas to the etching gas, on the change of the etching rate of chromium and resist and that of range/average.

Shown in FIG. 7 are the results thus observed when adding 0 to 72.1 SCCM of hydrogen gas to the etching gas, i.e. variations in the etching rate of chromium and resist and in the range/average as a function of the added amount of the hydrogen gas. In FIG. 7, the results were obtained by using a chromium mask blank and a chromium mask blank on which the above-mentioned EB resist is applied but is not patterned. As for the right longitudinal axis in FIG. 7, the range represents the difference between the maximum value and minimum value of a thickness of the resist film in a plane which were determined after etching and the average represents a mean value of the in-plane resist film thickness, the range/average being expressed in terms of %.

Figure 8:
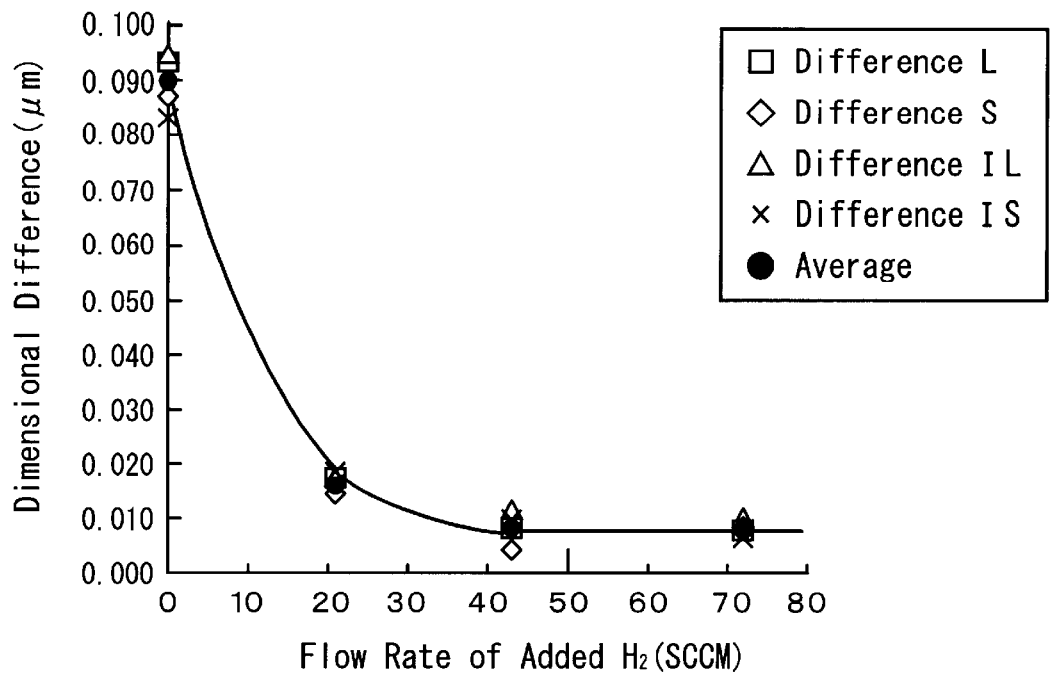
FIG. 8 is a graph showing the influence of the addition of hydrogen gas to the etching gas, on the change of the dimensional difference due to the coexistence of coarse and dense patterns observed when the test pattern shown in FIG. 5 is formed by etching.
Figure 9:
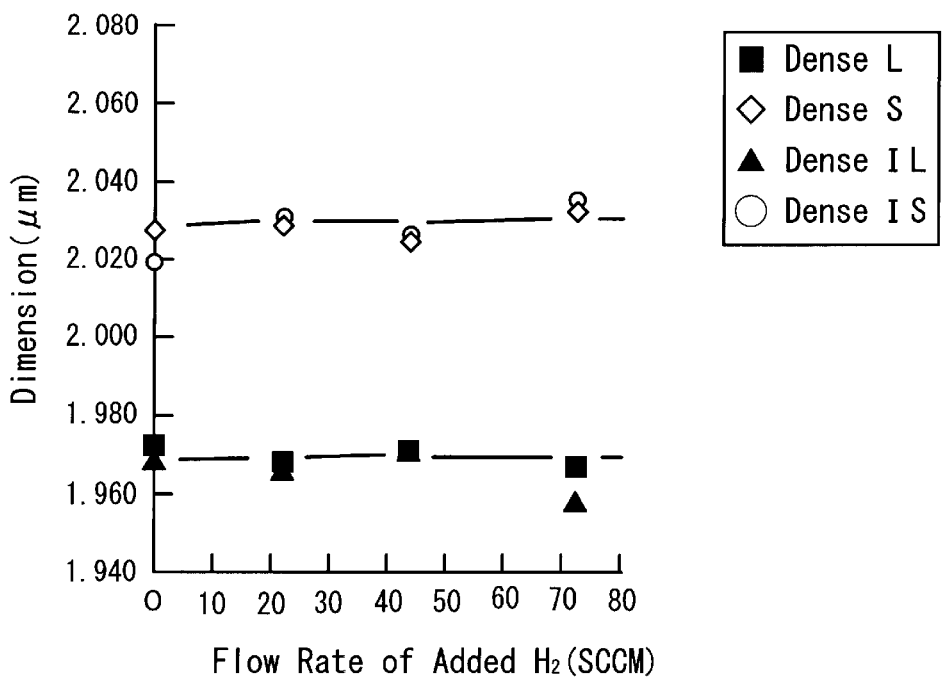
FIG. 9 is a graph showing the influence of hydrogen gas to the etching gas, on the change of the dimension of densely patterned portion observed when the test pattern shown in FIG. 5 is formed by etching.
Figure 10:
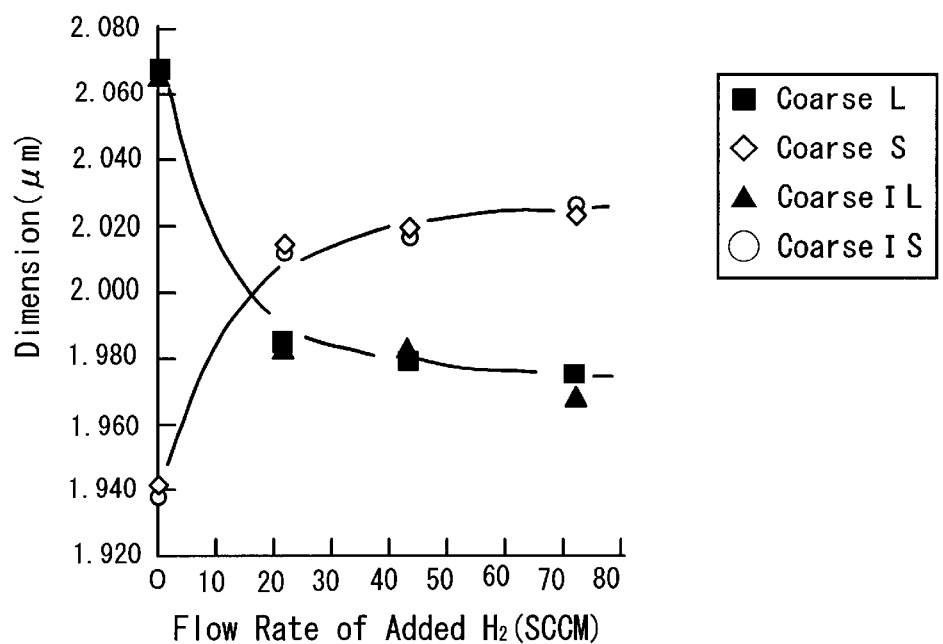
FIG. 10 is a graph showing the influence of the flow rate of added hydrogen gas to the etching gas, on the change of the dimension of coarsely patterned portion observed when the test pattern shown in FIG. 5 is formed by etching.
Figure 11:
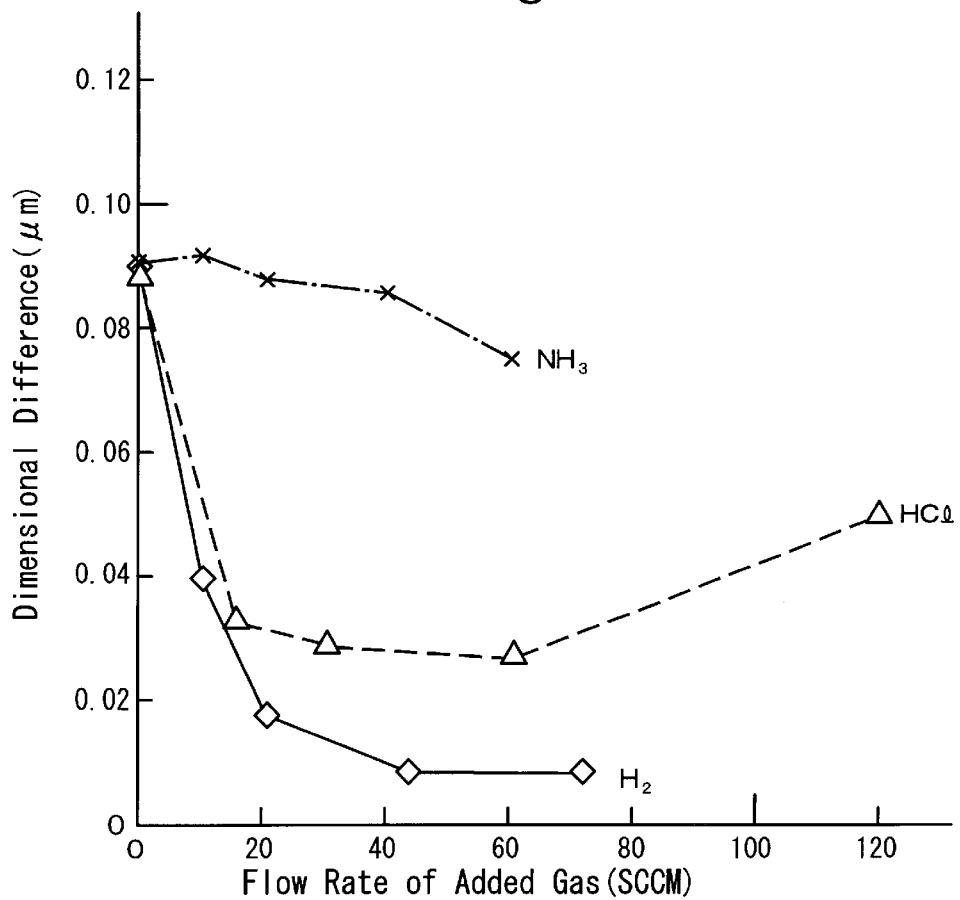
FIG. 11 is a graph showing the influence of the addition of hydrogen chloride gas or $NH_3$ gas to the etching gas, on the change of the dimensional difference due to the coexistence of coarse and dense patterns observed when the test pattern shown in FIG. 5 is formed by etching, in comparison with the influence of hydrogen gas.

Shown in FIG. 8 are the results observed when forming test patterns (FIGS. 5(A) and (B)) which comprised dense and coarse patterns arranged in a plane, or the variation of the dimensional difference between the coarse and dense portions (i.e., the difference in the dimension between the coarse and dense portions) as a function of the added amount of the hydrogen gas. In addition, shown in the following Table 2 and FIGS. 9 and 10 are the changes in the dimension of the coarse and dense portions as a function of the amount of the hydrogen gas which is added to the etching gas when the test patterns are formed through dry-etching. Moreover, the data shown in FIG. 8 are shown in FIG. 11 as a function of the added amount of the gases while comparing these results with those obtained in the other Examples. Shown in the following Table 3 are the dimensional variation in the coarse and dense portions of the resist pattern obtained after the development as a function of the added amount of the hydrogen gas, hydrogen chloride gas or $NH_3$ gas.

The following were found, as a result of the dry-etching performed under the conditions as mentioned in Table 1:

As will be seen from the results shown in FIG. 7, it was observed that when the hydrogen gas is added to the etching gas, the etching rate of chromium increases as the added amount of the hydrogen gas increases, is at the highest when adding about 20 to 45 SCCM of the hydrogen gas and decreases as the added amount of the hydrogen gas increases even further; the etching rate of the resist increases as the added amount of the hydrogen gas increases; and as for the in-plane resist film thickness, the range/average, i.e. ((Maximum film thickness-Minimum film thickness)/mean film thickness)×100 (%), decreases as the added amount of the hydrogen gas increases.

As will be seen from the results shown in Table 2 and FIGS. 8 and 11, there was observed a dimensional difference of about 90 nm (0.090 μm) between the coarse and dense portions when any hydrogen gas was not added to the etching gas, while the dimensional difference therebetween is reduced as the added amount of the hydrogen gas increases. More specifically, when an increasing amounts of hydrogen gas ranging from 10 to 72.1 SCCM were added as in Sample Nos. 1-2, 1-3, 1-4 and 1-5, the dimensional difference between the coarse and dense portions of the pattern was found to be about 0.040 to 0.009 μm which corresponded to about 1/2.2 to 1/10 times that (0.090 μm) observed when any hydrogen gas was not added. This clearly indicates that the problem of the dimensional difference between the coarse and dense portions is considerably eliminated. As shown in Table 1, the gas flow rates of $Cl_2$, $O_2$ and $H_2$ and the relative flow rates (as expressed in terms of % by volume) used in the dry-etching of the samples 1-2, 1-3, 1-4 and 1-5 are 80,20 and 10 to 72.1 SCCM and 72.73 to 46.48, 18.18 to 11.62 and 9.09 to 41.89% by volume, respectively.

As will be seen from the results shown in Table 1 and FIGS. 9 and 10, it was observed that the dimensions of the dense portions do not almost change due to the addition of the hydrogen gas, while the dimension of the coarse portion changes by a large amount until the added amount of the hydrogen gas reaches 30 SCCM and the change in the dimension of the coarse portion is reduced when the added amount of hydrogen gas is beyond 30 SCCM. As a result, the dimension of the coarse portion is close to that of the dense portion and therefore the dimensional difference between the dense and coarse portions becomes small.

As has been discussed above, it has been proved that the conditions for dry-etching the samples 1-2, 1-3, 1-4 and 1-5 are optimum ones and accordingly, the apparatus was so designed that the parameters relating to the foregoing dry-etching conditions listed in Table 1 were inputted, directly or through a memory device of a computer, to the sequencer and then the dry-etching process was started to automatically carry out the dry-etching under the foregoing optimum dry-etching conditions.

EXAMPLE 2

A dry-etching method carried out according to the present invention will be described in this Example. The low reflection chromium photomask blank and the test patterns used in this Example were the same as those used in Example 1. The scheme for preparing the test samples were the same as that used in Example 1 except that ZEP7000 (the trade name of a product available from Nippon Zeon Co., Ltd.) was substituted for the ZEP-810S as the resist for the EB exposure in the EB patterning process and that hydrogen chloride (HCl) gas, as the gas to be added to the etching gas, was substituted for the hydrogen gas ($H_2$) used in Example 1 in the etching step. The pattern-forming conditions are listed in the following Table 1 together with those used in Example 1.

Figure 12:
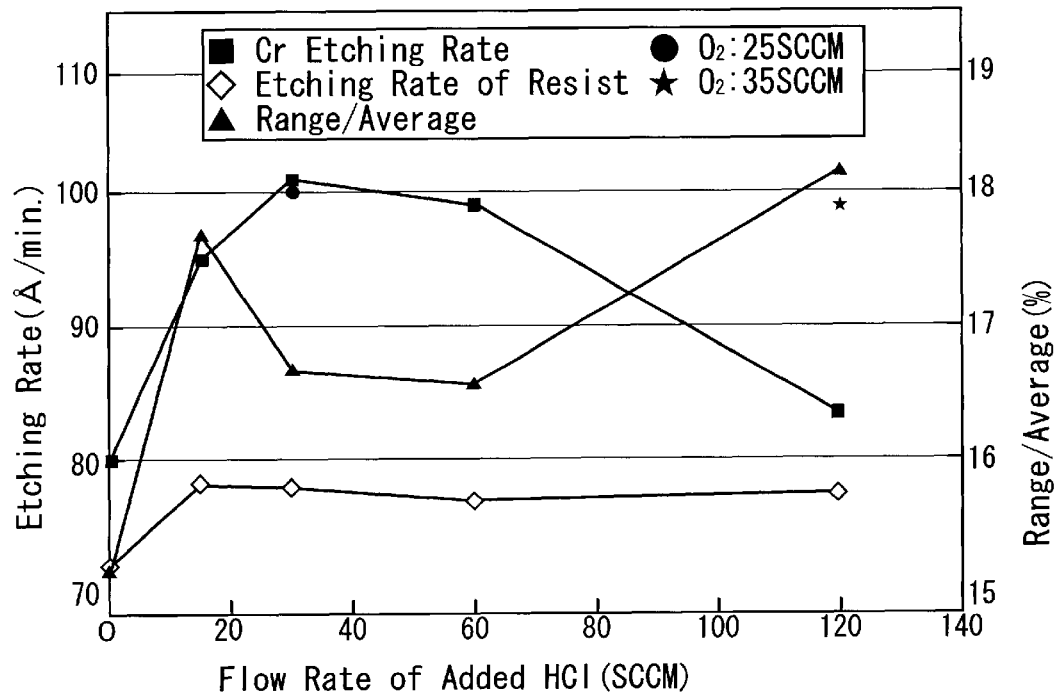
FIG. 12 is a graph showing the influence of the flow rate of added hydrogen chloride gas to the etching gas, on the change of the etching rate of chromium and resist and that of range/average.

HCl gas was added to the etching gas in an amount ranging from 0 to 120 SCCM in this Example. Regarding the results observed after carrying out the etching under the conditions specified in Table 1, the change in the etching rate of each of chromium and resist and that in the range/average are shown as a function of the added amount of HCl gas in FIG. 12. In FIG. 12, the results were obtained by using a chromium mask blank on which the above-mentioned EB resist is applied, without any patterning, as in this case of FIG. 7. As for the right longitudinal axis in FIG. 12, the range/average is the same as that shown in FIG. 7.

Shown in FIG. 11 are the results observed when forming test patterns (FIGS. 5(A) and (B)) which comprised dense and coarse patterns arranged in a plane. Namely, the change in the averaged dimensional difference between the coarse and dense portions (i.e., the difference in the dimension between the coarse and dense portions) as a function of the added amount of the HCl gas was shown in FIG. 11 while comparing these results with those obtained in Example 1 in which hydrogen gas was used as the added gas component. In addition, shown in the following Table 2 are the change in the dimension of the coarse and dense portions as a function of the amount of the hydrogen chloride gas which is added to the etching gas when the test patterns are formed through dry-etching, together with the results obtained in Example 1 in which hydrogen gas is added. Shown in the following Table 3 are the dimensional variation in the coarse and dense portions of the resist pattern obtained after the development as a function of the added gas and an added amount thereof.

As will be seen from the results shown in FIG. 12, when adding the hydrogen chloride gas to the etching gas, the etching rate of chromium is at the highest when adding about 30 to 40 SCCM of the hydrogen chloride gas and decreases as the added amount of the hydrogen chloride increases even further, while the etching rate of chromium increases by increasing an amount of oxygen. In addition, it was observed that the etching rate of the resist increased until the added amount of the hydrogen chloride gas reaches 15 SCCM and, even if the added amount of the hydrogen chloride gas increased even further, the etching rate was kept at a constant rate until the added amount reaches 120 SCCM.

As will be seen from the data shown in Table 2 and FIG. 11, the results of Sample Nos. 2-2, 2-3, 2-4 and 2-5 indicate that when HCl gas was added in an amount ranging from 15 to 120 SCCM to the etching gas, the dimensional difference between the coarse and dense portions of the patterns was in the range of from about 0.027 to 0.050 μm which corresponded to about 1/3.2 to 1/1.8 times that (0.088 μm) observed when any HCl gas was not added. This clearly indicates that the problem of the dimensional difference between the coarse and dense portions is considerably eliminated. The result of dimensional difference may further be improved by optimizing the relative flow rates of gas components in the etching gas. As shown in Table 1, the gas flow rates of $Cl_2$, $O_2$ and HCl and the relative flow rates (expressed in terms of % by volume) used in the dry-etching of the samples 2-2, 2-3, 2-4 and 2-5 are 80, 20 and 15 to 120 SCCM; and 69.57 to 36.36, 17.39 to 9.09 and 13.04 to 54.54% by volume, respectively.

Moreover, the etching operation may be safer by the use of HCl gas in place of hydrogen gas as the added gas.

As has been described above in detail, it has been proved that the conditions for dry-etching the samples 2-2, 2-3, 2-4 and 2-5 are optimum ones and accordingly, the apparatus was so designed that the parameters relating to the foregoing dry-etching conditions listed in Table 1 were inputted, directly or through a memory device of a computer, to the sequencer and then the dry-etching process was started to automatically carry out the dry-etching under the foregoing optimum dry-etching conditions.

EXAMPLE 3

A dry-etching method carried out according to the present invention will be described in this Example. The low reflection chromium photomask blank and the test patterns used in this Example were the same as those used in Example 1. The scheme for preparing the test samples were the same as that used in Example 1 except that ZEP7000 (the trade name of a product available from Nippon Zeon Co., Ltd.) was substituted for the ZEP-810S as the resist for the EB exposure in the EB patterning process and that $NH_3$ gas, as the gas to be added to the etching gas, was substituted for the hydrogen gas ($H_2$) used in Example 1 in the etching step. The pattern-forming conditions are listed in the following Table 1 together with those used in Examples 1 and 2.

Figure 13:
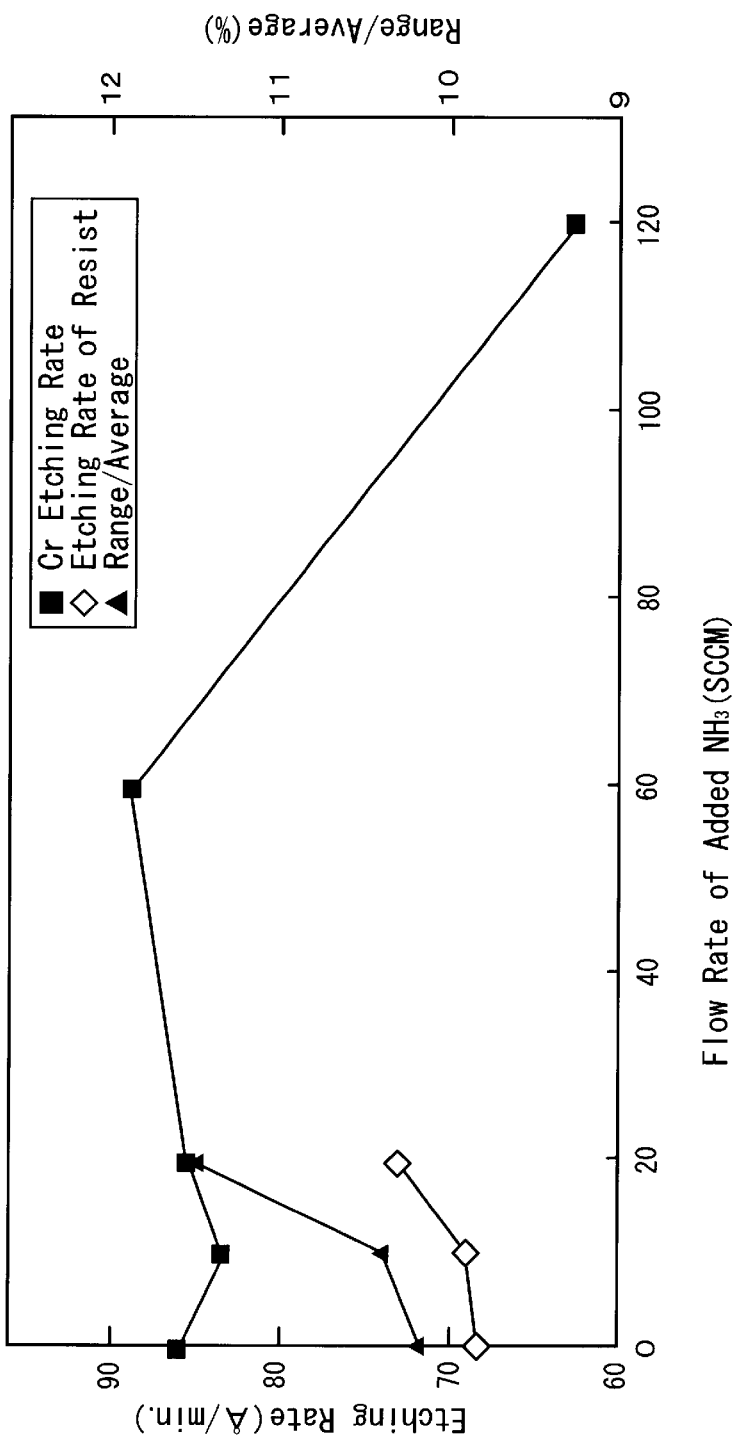
FIG. 13 is a graph showing the influence of the flow rate of added $NH_3$ to the etching gas, on the change of the etching rate of chromium and resist and that of range.

HCl gas was added to the etching gas in an amount ranging from 0 to 120 SCCM in this Example. Regarding the results observed after carrying out the etching under the conditions specified in Table 1, the change in the etching rate of chromium when adding $NH_3$ to the etching gas in an amount ranging from 0 to 120 SCCM and that in the etching rate of resist when adding NH3 in an amount ranging from 0 to 20 SCCM and the range/average are shown as a function of the added amount of $NH_3$ gas in FIG. 13. In FIG. 13, the results were obtained by using a chromium mask blank or a chromium mask blank on which the above-mentioned EB resist is applied, without any patterning, as in this case of FIG. 7. As for the right longitudinal axis in FIG. 13, the range/average is the same as that shown in FIG. 7.

Shown in FIG. 11 are the results observed when forming test patterns (FIGS. 5(A) and (B)) which comprised dense and coarse patterns arranged in a plane. Namely, the change in the averaged dimensional difference between the coarse and dense portions (i.e., the difference in the dimension between the coarse and dense portions) as a function of the added amount of the $NH_3$ gas was shown in FIG. 11 while comparing these results with those obtained in Example 1 in which hydrogen gas was used as the added gas component. In addition, shown in the following Table 2 are the change in the dimension of the coarse and dense portions as a function of the amount of the $NH_3$ gas which is added to the etching gas when the test patterns are formed through dry-etching, together with the results obtained in Example 1 in which hydrogen gas is added and Example 2 in which HCl gas is added. Shown in the following Table 3 are the dimensional variation in the coarse and dense portions of the resist pattern obtained after the development as a function of the added gas and an added amount thereof.

As will be seen from the results shown in Table 2 and FIG. 13, when adding the $NH_3$ gas to the etching gas, the etching rate of chromium slightly increases until the added amount of the $NH_3$ gas reaches 60 SCCM and decreases as the added amount of the $NH_3$ gas increases even further. In addition, the etching rate of resist decreases a little until the added amount of the $NH_3$ gas reaches 20 SCCM.

As will be seen from the data shown in Table 2 and FIG. 11, there is observed a dimensional difference of about 0.075 μm between the coarse and dense portions of the patterns when $NH_3$ gas was added in an amount 60 SCCM to the etching gas. Thus, it can be said that this dimensional difference of about 0.075 μm corresponded to about 1/1.2 times that (0.090 μm) observed when any $NH_3$ gas was not added.

Moreover, the etching operation may be safer by the use of $NH_3$ gas in place of hydrogen gas as the added gas. It is difficult to further improve the dimensional difference of the coarse and dense portions of the patterns, even if the relative flow rate of the etching gases were optimized.

TABLE 1

Pattern-Forming Conditions

| | | | Resist Layer | | Dry-Etching Conditions | | | | | | | Just | Total |
|---|---|---|---|---|---|---|---|---|---|---|---|---|---|
| Ex. No. | Added Etching Gas | Sample No. | Resist | Thickness of Resist Å | Cl₂ SCCM | O₂ SCCM | Added Gas SCCM | RF Power Supply W | Pressure Pa | Magnetic Field Gauss | Interelectrode Distance mm | Etching Time sec | Etching Time sec |
| 1 | H₂ | 1-1 | ZEP810S | 3000 | (80) 80 | (20) 20 | (0) 0 | 80 | 6.8 | 50–60 | 60 | 296 | 888 |
| | | 1-2 | " | " | (72.73) 80 | (18.18) 20 | (9.09) 10 | " | " | " | " | 275 | 625 |
| | | 1-3 | " | " | (65.79) 80 | (16.45) 20 | (17.76) 21.6 | " | " | " | " | 185 | 556 |
| | | 1-4 | " | " | (55.83) 80 | (13.96) 20 | (30.22) 43.3 | " | " | " | " | 205 | 615 |
| | | 1-5 | " | " | (46.48) 80 | (11.62) 20 | (41.89) 72.1 | " | " | " | " | 240 | 721 |
| 2 | HCl | 2-1 | ZEP7000 | 4000 | (80) 80 | (20) 20 | (0) 0 | 80 | 6.8 | 50–60 | 60 | 296 | 888 |
| | | 2-2 | " | " | (69.57) 80 | (17.39) 20 | (13.04) 15 | " | " | " | " | 175 | 525 |
| | | 2-3 | " | " | (61.54) 80 | (15.38) 20 | (23.08) 30 | " | " | " | " | 174 | 522 |
| | | 2-4 | " | " | (50.00) 80 | (12.50) 20 | (37.50) 60 | " | " | " | " | 195 | 585 |
| | | 2-5 | " | " | (36.36) 80 | (9.09) 20 | (54.54) 120 | " | " | " | " | 250 | 750 |
| 3 | NH₃ | 3-1 | ZEP7000 | 4000 | (100) 80 | (20) 20 | (0) 0 | 80 | 6.8 | 50–60 | 60 | 285 | 855 |
| | | 3-2 | " | " | (72.73) 80 | (18.18) 20 | (9.09) 10 | " | " | " | " | 290 | 870 |
| | | 3-3 | " | " | (66.67) 80 | (16.67) 20 | (16.67) 20 | " | " | " | " | 283 | 849 |
| | | 3-4 | " | " | (57.14) 80 | (14.29) 20 | (28.57) 40 | " | " | " | " | 251 | 753 |
| | | 3-5 | " | " | (50.00) 80 | (13.50) 20 | (37.50) 60 | " | " | " | " | 244 | 732 |

(Note)
The numerical value in the parenthesis corresponds to the flow rate expressed in terms of "% by volume".

TABLE 2

Dimensions of Patterns Observed After Dry-Etching

| | | | Flow Rate of Added Gas SCCM | Dense Portion (Large Removed Area) [μm] | | | | Coarse Portion (Small Removed Area) [μm] | | | | Difference Between Coarse and Dense Portions (Course-Dense) [μm] | | | | Average (Absolute Value) |
|---|---|---|---|---|---|---|---|---|---|---|---|---|---|---|---|---|
| Ex. No. | Added Etching Gas | Sample No. | | L/S Line | L/S Space | ISO Line | ISO Space | L/S Line | L/S Space | ISO Line | ISO Space | L/S Line | L/S Space | ISO Line | ISO Space | |
| 1 | H₂ | 1-1 | 0 | 1.974 | 2.029 | 1.970 | 2.021 | 2.067 | 1.942 | 2.065 | 1.938 | 0.093 | −0.087 | 0.095 | 0.083 | 0.09 |
| | | 1-2 | 10 | 1.878 | 2.118 | 1.874 | 2.121 | 1.914 | 2.081 | 1.912 | 2.074 | 0.036 | −0.037 | 0.038 | 0.047 | 0.040 |
| | | 1-3 | 21.6 | 1.969 | 2.030 | 1.967 | 2.032 | 1.987 | 2.015 | 1.985 | 2.013 | 0.018 | −0.015 | 0.018 | 0.019 | 0.018 |
| | | 1-4 | 43.3 | 1.972 | 2.025 | 1.972 | 2.027 | 1.981 | 2.020 | 1.984 | 2.017 | 0.009 | −0.005 | 0.012 | 0.010 | 0.009 |
| | | 1-5 | 72.1 | 1.967 | 2.032 | 1.958 | 2.035 | 1.976 | 2.023 | 1.969 | 2.027 | 0.009 | −0.009 | 0.011 | 0.008 | 0.009 |
| 2 | HCl | 2-1 | 0 | 1.941 | 2.058 | 1.927 | 2.056 | 2.029 | 1.975 | 2.029 | 1.976 | 0.088 | −0.083 | 0.102 | 0.080 | 0.088 |
| | | 2-2 | 15 | 1.897 | 2.093 | 1.896 | 2.084 | 1.938 | 2.063 | 1.936 | 2.059 | 0.041 | −0.030 | 0.040 | 0.025 | 0.035 |
| | | 2-3 | 30 | 1.895 | 2.099 | 1.892 | 2.086 | 1.931 | 2.069 | 1.921 | 2.067 | 0.036 | −0.030 | 0.029 | 0.019 | 0.029 |
| | | 2-4 | 60 | 1.905 | 2.091 | 1.893 | 2.098 | 1.930 | 2.065 | 1.923 | 2.070 | 0.025 | −0.026 | 0.030 | 0.028 | 0.027 |
| | | 2-5 | 120 | 1.889 | 2.108 | 1.881 | 2.110 | 1.937 | 2.056 | 1.930 | 2.058 | 0.048 | −0.052 | 0.049 | 0.052 | 0.050 |
| 3 | NH₃ | 3-1 | 0 | 1.947 | 2.053 | 1.948 | 2.057 | 2.043 | 1.967 | 2.038 | 1.968 | 0.096 | −0.086 | 0.090 | 0.089 | 0.090 |
| | | 3-2 | 10 | 1.938 | 2.060 | 1.934 | 2.061 | 2.034 | 1.975 | 2.030 | 1.971 | 0.096 | −0.085 | 0.096 | −0.090 | 0.092 |
| | | 3-3 | 20 | 1.941 | 2.050 | 1.945 | 2.045 | 2.039 | 1.964 | 2.038 | 1.969 | 0.098 | −0.086 | 0.093 | −0.076 | 0.088 |
| | | 3-4 | 40 | 1.916 | 2.077 | 1.912 | 2.075 | 2.008 | 1.997 | 2.003 | 1.995 | 0.092 | −0.080 | 0.091 | −0.080 | 0.086 |
| | | 3-5 | 60 | 1.908 | 2.088 | 1.902 | 2.089 | 1.988 | 2.014 | 1.978 | 2.018 | 0.080 | −0.074 | 0.076 | −0.071 | 0.075 |

(Note)
L/S: Line and Space
L: Line
S: Space
ISO: Isolated

TABLE 3

Dimensions of Resist Patterns Observed After Development

| Ex. No. | Added Etching Gas | Sample No. | Flow Rate of Added Gas SCCM | Dense Portion (Large Removed Area) [μm] | | | | Coarse Portion (Small Removed Area) [μm] | | | | Difference Between Coarse and Dense Portions (Course-Dense) [μm] | | | | Average (Absolute Value) |
|---|---|---|---|---|---|---|---|---|---|---|---|---|---|---|---|---|
| | | | | L/S Line | L/S Space | ISO Line | ISO Space | L/S Line | L/S Space | ISO Line | ISO Space | L/S Line | L/S Space | ISO Line | ISO Space | |
| 1 | H₂ | 1-1 | 0 | 2.079 | 1.440 | 2.081 | 1.439 | 2.116 | 1.391 | 2.101 | 1.409 | 0.037 | −0.049 | 0.021 | −0.039 | — |
| | | 1-2 | 10 | 2.090 | 1.428 | 2.092 | 1.424 | 2.112 | 1.396 | 2.112 | 1.400 | 0.022 | −0.032 | 0.020 | −0.024 | — |
| | | 1-3 | 21.6 | 2.091 | 1.420 | 2.067 | 1.425 | 2.113 | 1.395 | 2.107 | 1.387 | 0.022 | −0.025 | 0.040 | −0.038 | — |
| | | 1-4 | 43.3 | 2.092 | 1.422 | 2.099 | 1.412 | 2.132 | 1.373 | 2.129 | 1.375 | 0.040 | −0.049 | 0.030 | −0.037 | — |
| | | 1-5 | 72.1 | 2.070 | 1.415 | 2.082 | 1.420 | 2.128 | 1.382 | 2.125 | 1.386 | 0.058 | −0.033 | 0.043 | −0.034 | — |
| 2 | HCl | 2-1 | 0 | 2.076 | 1.394 | 2.066 | 1.394 | 2.106 | 1.379 | 2.117 | 1.362 | 0.030 | −0.015 | 0.051 | −0.032 | — |
| | | 2-2 | 15 | 2.072 | 1.404 | 2.063 | 1.391 | 2.113 | 1.358 | 2.113 | 1.352 | 0.041 | −0.046 | 0.050 | −0.039 | — |
| | | 2-3 | 30 | 2.064 | 1.391 | 2.063 | 1.402 | 2.103 | 1.352 | 2.113 | 1.351 | 0.039 | −0.039 | 0.050 | −0.051 | — |
| | | 2-4 | 60 | 2.064 | 1.395 | 2.062 | 1.394 | 2.108 | 1.357 | 2.100 | 1.355 | 0.044 | −0.038 | 0.038 | −0.039 | — |
| | | 2-5 | 120 | 2.063 | 1.383 | 2.053 | 1.393 | 2.107 | 1.362 | 2.102 | 1.353 | 0.044 | −0.021 | 0.049 | −0.040 | — |
| 3 | NH₃ | 3-1 | 0 | 2.082 | 1.384 | 2.080 | 1.371 | 2.130 | 1.332 | 2.129 | 1.336 | 0.048 | −0.052 | 0.049 | −0.035 | — |
| | | 3-2 | 10 | 2.073 | 1.392 | 2.072 | 1.387 | 2.116 | 1.339 | 2.116 | 1.341 | 0.043 | −0.053 | 0.044 | −0.046 | — |
| | | 3-3 | 20 | 2.071 | 1.386 | 2.070 | 1.379 | 2.110 | 1.358 | 2.113 | 1.356 | 0.039 | −0.028 | 0.043 | −0.023 | — |
| | | 3-4 | 40 | 2.074 | 1.383 | 2.062 | 1.383 | 2.111 | 1.350 | 2.100 | 1.354 | 0.037 | −0.033 | 0.038 | −0.029 | — |
| | | 3-5 | 60 | 2.067 | 1.399 | 2.053 | 1.389 | 2.101 | 1.361 | 2.093 | 1.343 | 0.034 | −0.038 | 0.040 | −0.046 | — |

EXAMPLE 4

In the light of the results obtained in Examples 1 and 2, it was found that the use of hydrogen and hydrogen chloride gases in dry-etching as the gas component to be added to the etching gas permits the reduction of the dimensional difference due to the coexistence of coarsely and densely patterned portions in a plane and the formation of high precision patterned products by etching. Accordingly, there were prepared several kinds of photomasks according to the procedures used, in Examples 1 and 2, for preparing the test samples carrying test patterns, or by forming a resist layer on a Cr photomask blank, followed by a series of well-known pattern-forming steps such as light-exposure, development, etching and washing. The resulting photomasks each had patterns such as hole systems or line-and-space patterns to be transferred to a wafer and comprised, on a plane, coexisting coarse and dense patterns. The resulting photomask was found to have a very small dimensional difference between the coarse and dense portions of the patterns. These results clearly indicate that the use of the foregoing added gas permits the achievement of quite satisfactory results, i.e., substantial reduction of the dimensional difference, like the results observed in Examples 1 and 2.

EXAMPLE 5

A semiconductor circuit was formed on a wafer by repeating the following steps (1) to (4) using the photomask prepared in Example 4:
(1) A light-sensitive material was applied onto the wafer;
(2) The patterns on the photomask were scaled down and transferred to the wafer using a stepper (scale factor: 1/5, 1/4 or 1/2);
(3) The wafer provided thereon with the exposed light-sensitive material was developed to form a resist pattern on the wafer;
(4) The wafer was subjected to dry-etching or ion-implantation through the resist pattern.

The semiconductor circuits thus produced were a memory circuit (FIG. 14) whose patterns were regularly arranged, a logic circuit whose patterns were randomly arranged and a system LSI circuit (see FIG. 15) comprising combined memory and logic circuits.

Figure 14:
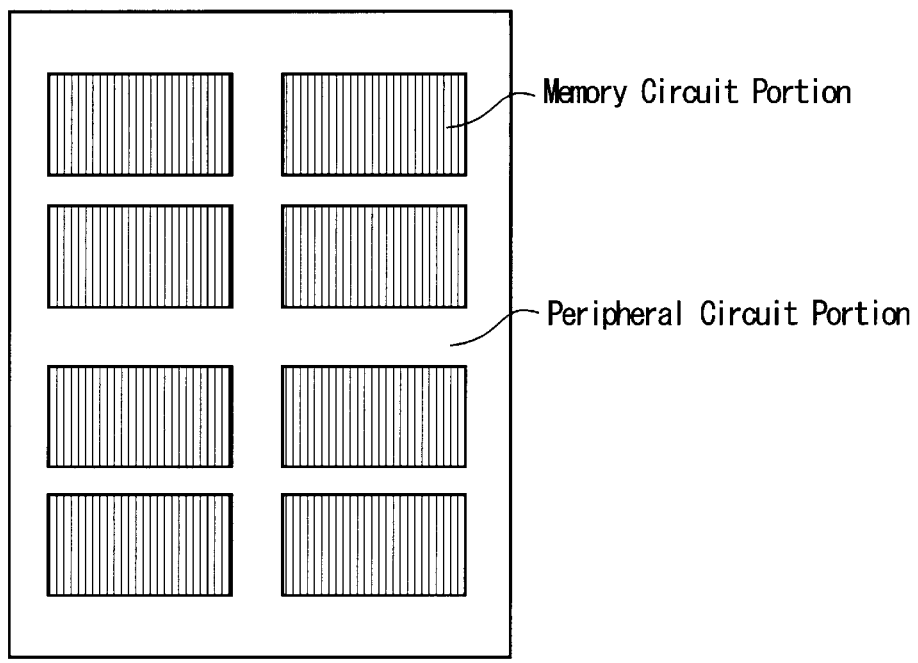
FIG. 14 is a schematic diagram showing the structure of a memory circuit of the present invention, which comprises a memory circuit portion and a peripheral circuit portion.
Figure 15:
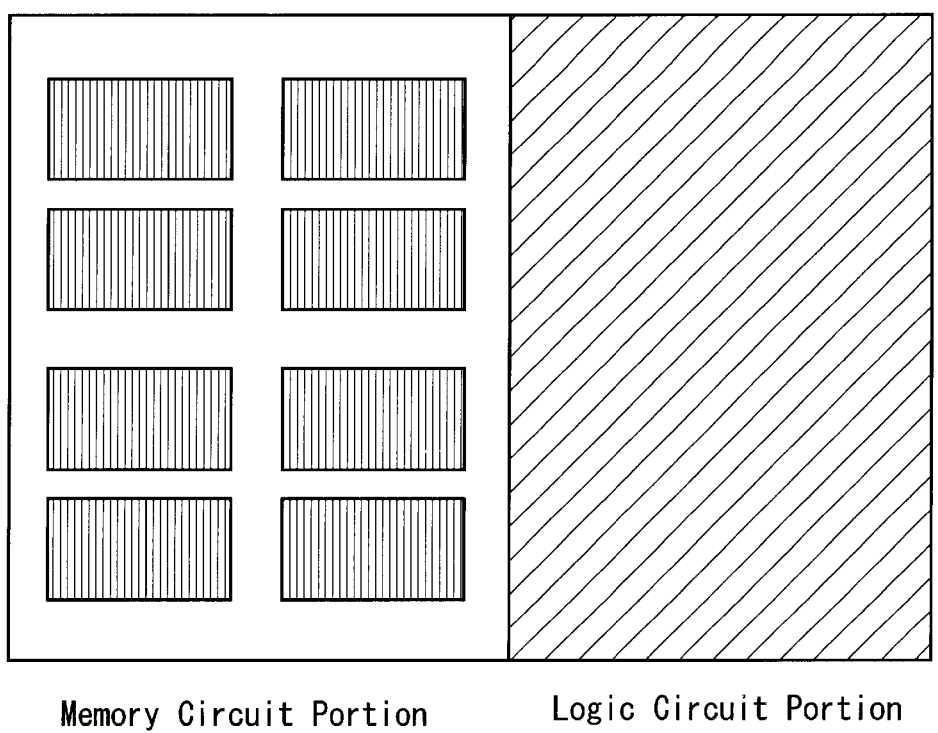
FIG. 15 is a schematic diagram showing the structure of a system LSI circuit of the present invention which comprises combined memory circuit and logic circuit portions.

The memory circuit as shown in FIG. 14 comprises a memory circuit portion whose patterns are regularly arranged and a peripheral circuit portion in which patterns are irregularly arranged in order to ensure the connection to the exterior and these circuit portions differ from each other in the rate of the area occupied by the patterns. In the transistor gate-forming process which has a serious influence on the characteristics of the circuit, the rate of the area removed for patterning on the peripheral circuit portion increases in proportion to an increase in the size of the memory cell portion, i.e. is higher than that of the memory cell portion. In the case of the semiconductor circuit produced according to the present invention, the dimensional difference observed between the memory cell and peripheral circuit portions is very small and on the order of about 0.004 μm and this indicates that the amount of the dimensional variation is not more than 2%. Consequently, the patterns never adversely affect the characteristic properties of the resulting circuit. Thus, satisfactory semiconductor circuits could be produced according to the present invention, which did not show any difference between the memory cell and peripheral circuit portions in characteristic properties.

Moreover, the semiconductor circuit or logic circuit produced in this Example was found to have excellent quality, since the same effect described above could also be attained by the logic circuit in which patterns were randomly distributed and the areas removed for patterning were also randomly distributed and the dimensional difference within the chip was found to be very small on the order of not more than 0.004 μm. It was also found that the present invention permitted the production of an excellent semiconductor circuit or a system LSI circuit comprising combined memory and logic circuit portions (FIG. 15), which did not differ from each other in characteristic properties. This is because the memory and logic circuit portions differ from each other in the density of patterns, but the dimensional difference between the memory cell and logic circuit portions is very small on the order of 0.004 μm and therefore, the patterns never adversely affect the characteristic properties of the resulting circuit.

As has been discussed above in detail, the method of the present invention permits the decrease of the dimensional difference due to the coexistence of coarsely and densely patterned portions in a plane and the production of a high precision pattern-etched product by using a mixed gas, which comprises (a) a reactive ion etching gas as a mixture of an oxygen-containing gas and a halogen-containing gas, and (b) a reducing gas containing at least hydrogen, in the dry-etching process as a means for forming fine patterns.

Moreover, the method for preparing a photomask according to the present invention permits a photomask which has a small dimensional difference due to the coexistence of the coarse and dense patterns in a plane and whose patterns are highly precisely processed. In addition, the photomask has uniform patterns. Further the semiconductor circuit produced using the photomask of the present invention has a very high integration density.

In addition, the use of hydrogen chloride gas instead of hydrogen gas as the added gas component can ensure safer etching procedures.

What is claimed is:

1. A dry-etching method which comprises dry-etching a metal thin film, wherein the method is characterized by using, as an etching gas, a mixed gas including (a) a reactive ion etching gas, which contains an oxygen-containing gas and a halogen-containing gas, and (b) a reducing gas comprising hydrogen chloride added to the gas component (a), in the process for dry-etching the metal thin film; and wherein the metal thin film is etched such that dense patterns and coarse patterns coexist in a plane, and maximum dimensional differences within the plane are controlled to be within 10 to 50 nm;

wherein said metal thin film is a chromium-containing film, said mixed gas comprises chlorine gas, oxygen gas and hydrogen chloride gas and the relative flow rates of these gases are 36 to 70, 9 to 18, and 13 to 55% by volume, respectively.

2. A method for preparing a photomask by performing a series of pattern-forming steps including a step for forming a resist layer on a photomask blank, a step for exposing and patterning said resist layer, a developing step, a step for etching said photomask blank and a step for removing said resist layer, wherein the method is characterized in that patterns to be transferred onto a wafer are formed on said photomask blank according to a dry-etching method comprising the steps of dry-etching a metal thin film, using, as an etching gas, a mixed gas including (a) a reactive ion etching gas, which contains an oxygen-containing gas and a halogen-containing gas, and (b) a reducing gas comprising hydrogen chloride added to the gas component (a), in the process for dry-etching the metal thin film; and wherein the metal thin film is etched such that dense patterns and coarse patterns coexist in a plane, and maximum dimensional differences within the plane are controlled to be within 10 to 50 nm;

wherein said metal thin film is a chromium-containing film, said mixed gas comprises chlorine gas, oxygen gas and hydrogen chloride gas and the relative flow rates of these gases are 36 to 70, 9 to 18, and 13 to 55% by volume, respectively; and then;

to thus give a photomask.

3. A method for manufacturing a semiconductor circuit which comprises the steps of transferring patterns formed on a photomask by the method of claim 2 onto a wafer on which a light-sensitive material is coated, developing said light-sensitive material to form resist patterns on the wafer, to manufacture a semiconductor circuit which comprises coexisting coarse and dense patterns corresponding to said resist patterns.

4. The dry-etching method as set forth in claim 1 wherein said chromium-containing thin film is an alloy that further contains a member selected from the group consisting of Al, Au, Pt, Ag, Si, Ge, Fe, Cu, Ni, Ta, Mo, W, Zr, and two or more of these metals.

5. The dry-etching method as set forth in claim 1 wherein said chromium-containing film is a thin film selected from the group consisting of chromium film, chromium oxide film, chromium nitride film, chromium fluoride film and a laminated chromium film thereof.

6. The dry-etching method as set forth in claim 4 wherein said chromium-containing thin film is a thin film selected from the group consisting of chromium film, chromium oxide film, chromium nitride film, chromium fluoride film and a laminated chromium film thereof.

* * * * *